(12) United States Patent
Hirler et al.

(10) Patent No.: US 11,508,841 B2
(45) Date of Patent: Nov. 22, 2022

(54) SEMICONDUCTOR DEVICE

(71) Applicant: Infineon Technologies Dresden GmbH & Co. KG, Dresden (DE)

(72) Inventors: Franz Hirler, Isen (DE); Christian Fachmann, Fuernitz (AT); Winfried Kaindl, Unterhaching (DE); Hans Weber, Bayerisch Gmain (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 3 days.

(21) Appl. No.: 16/892,556

(22) Filed: Jun. 4, 2020

(65) Prior Publication Data
US 2020/0388703 A1 Dec. 10, 2020

(30) Foreign Application Priority Data

Jun. 6, 2019 (EP) .................................... 19178597
Jul. 24, 2019 (EP) .................................... 19188027

(51) Int. Cl.
*H01L 29/78* (2006.01)
*H01L 29/06* (2006.01)
*H01L 29/10* (2006.01)

(52) U.S. Cl.
CPC ...... *H01L 29/7813* (2013.01); *H01L 29/0634* (2013.01); *H01L 29/1095* (2013.01); *H01L 29/7827* (2013.01)

(58) Field of Classification Search
CPC ............ H01L 29/7813; H01L 29/0634; H01L 29/1095; H01L 29/7827; H01L 29/0696; H01L 29/0865; H01L 29/41766; H01L 29/7802; H01L 29/7811; H01L 27/0823; H01L 27/088; H01L 29/7395; H01L 29/7831

(Continued)

(56) References Cited

U.S. PATENT DOCUMENTS 10,439,056 B2 * 10/2019 Arai .................. H01L 29/42372
2007/0114599 A1 * 5/2007 Hshieh ................ H01L 29/0634
257/330

(Continued)

FOREIGN PATENT DOCUMENTS

WO 2019087341 A1 5/2019

*Primary Examiner* — Mohammad M Hoque
(74) *Attorney, Agent, or Firm* — Murphy, Bilak & Homiller, PLLC

(57) ABSTRACT

A semiconductor device includes a semiconductor body having a first surface and second surface opposite to the first surface in a vertical direction, and a plurality of transistor cells at least partly integrated in the semiconductor body. Each transistor cell includes at least two source regions, first and second gate electrodes spaced apart from each other in a first horizontal direction and arranged adjacent to and dielectrically insulated from a continuous body region, a drift region separated from the at least two source regions by the body region, and at least three contact plugs extending from the body region towards a source electrode in the vertical direction. The at least three contact plugs are arranged successively between the first and second gate electrodes. Only the two outermost contact plugs that are arranged closest to the first and second gate electrodes, respectively, directly adjoin at least one of the source regions.

21 Claims, 8 Drawing Sheets

(58) Field of Classification Search
USPC .......................................................... 257/335
See application file for complete search history.

(56) References Cited

U.S. PATENT DOCUMENTS

| | | | | |
|---|---|---|---|---|
| 2008/0121986 | A1* | 5/2008 | Hshieh | H01L 29/7811 |
| | | | | 257/328 |
| 2009/0001456 | A1* | 1/2009 | Kim | H01L 21/823437 |
| | | | | 257/330 |
| 2010/0090274 | A1* | 4/2010 | Hsieh | H01L 29/0878 |
| | | | | 257/331 |
| 2010/0117145 | A1* | 5/2010 | Hshieh | H01L 29/407 |
| | | | | 257/330 |
| 2010/0289075 | A1* | 11/2010 | Lin | H01L 29/8725 |
| | | | | 257/334 |
| 2011/0215374 | A1* | 9/2011 | Lin | H01L 29/739 |
| | | | | 257/139 |
| 2012/0187477 | A1 | 7/2012 | Hsieh | |
| 2012/0193701 | A1* | 8/2012 | Lin | H01L 29/7808 |
| | | | | 257/328 |
| 2013/0264637 | A1 | 10/2013 | Katou et al. | |
| 2014/0103426 | A1 | 4/2014 | Hsieh | |
| 2015/0137223 | A1 | 5/2015 | Siemieniec et al. | |
| 2015/0279985 | A1* | 10/2015 | Philippou | H01L 29/4236 |
| | | | | 257/334 |
| 2018/0269318 | A1 | 9/2018 | Kitada et al. | |
| 2022/0059689 | A1* | 2/2022 | Shin | H01L 29/7813 |

* cited by examiner

SEMICONDUCTOR DEVICE

TECHNICAL FIELD

The instant disclosure relates to a semiconductor device, in particular to a superjunction semiconductor device.

BACKGROUND

Semiconductor devices such as insulated gate power transistor devices, e.g., power MOSFETs (Metal Oxide Semiconductor Field-Effect Transistors) or IGBTs (Insulated Gate Bipolar Transistors), are widely used as electronic switches in various types of electronic applications. In many applications the ruggedness (robustness) of such semiconductor devices is a critical aspect. Many applications require the switching of unclamped inductive loads which may cause high stresses within the transistor device due to high currents which induce high device temperatures. In some semiconductor devices, there is a risk that the activation of unwanted parasitic bipolar transistors will decrease the breakdown voltage of the semiconductor device.

It is desirable to provide a robust semiconductor device with a reduced risk of activation of unwanted parasitic bipolar transistors and having an increased breakdown voltage.

SUMMARY

One example relates to a semiconductor device including a semiconductor body including a first surface and a second surface opposite to the first surface in a vertical direction, and a plurality of transistor cells at least partly integrated in the semiconductor body. Each of the plurality of transistor cells includes at least two source regions, a first gate electrode and a second gate electrode spaced apart from each other in a first horizontal direction, each of the first gate electrode and the second gate electrode being arranged adjacent to and dielectrically insulated from a continuous body region, a drift region separated from the at least two source regions by the body region, and at least three contact plugs extending from the body region towards a source electrode in the vertical direction, wherein the at least three contact plugs are arranged successively between the first gate electrode and the second gate electrode, and wherein only the two outermost contact plugs that are arranged closest to the first gate electrode and the second gate electrode directly adjoin at least one of the source regions.

Another example relates to a semiconductor device, including a semiconductor body comprising a first surface and a second surface opposite to the first surface in a vertical direction, a plurality of transistor cells at least partly integrated in the semiconductor body, each of the plurality of transistor cells including a single source region, a first gate electrode and a second gate electrode spaced apart from each other in a first horizontal direction, each of the first gate electrode and the second gate electrode being arranged adjacent to and dielectrically insulated from a continuous body, region, a drift region separated from the single source region by the body region, and at least two contact plugs extending from the body region towards a source electrode in the vertical direction, wherein the at least two contact plugs are arranged successively between the first gate electrode and the second gate electrode, and wherein at least one of the at least two contact plugs does not directly adjoin the source region.

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
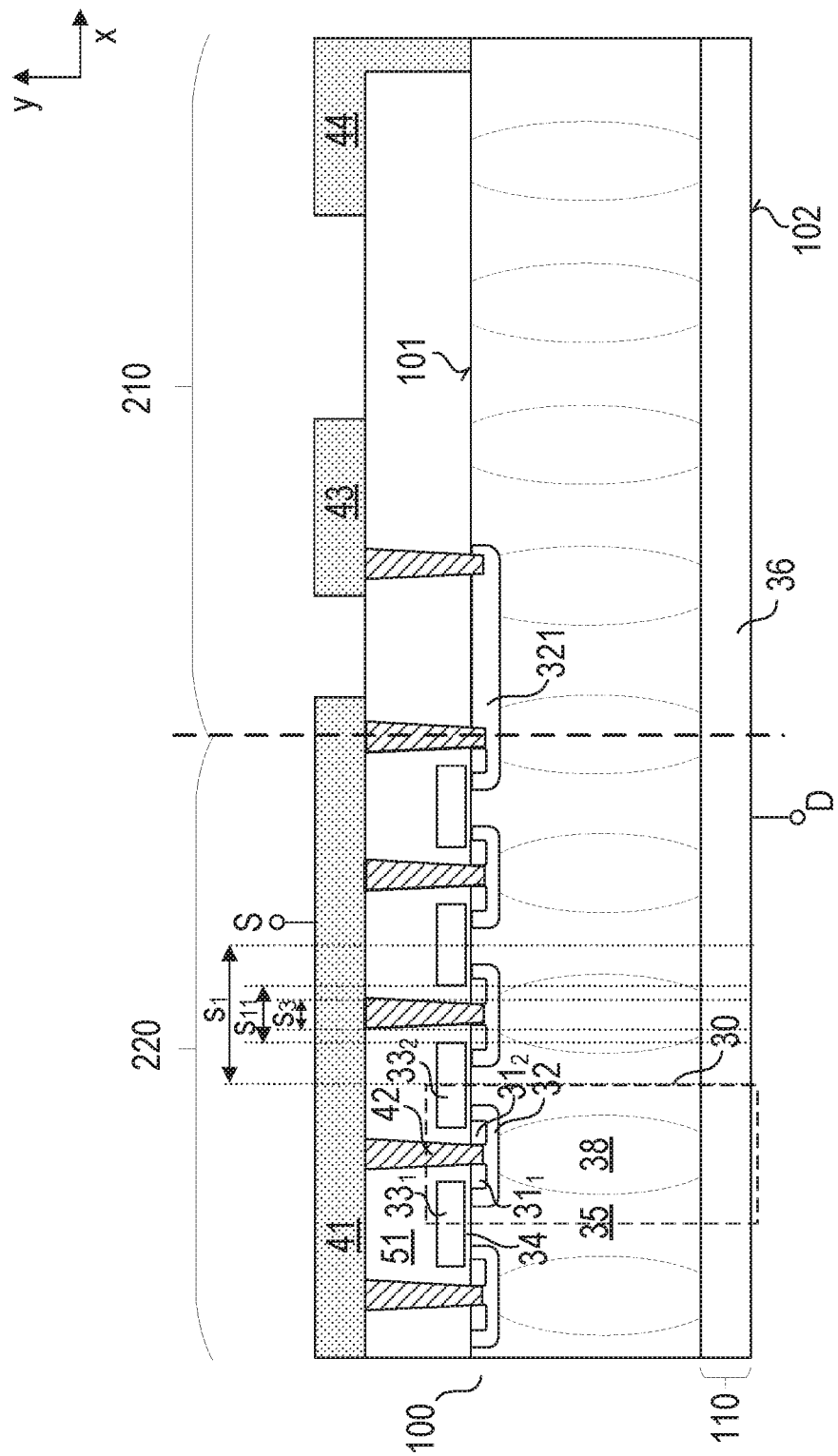
FIG. 1 schematically illustrates cross sectional views of a semiconductor body.

Referring to FIG. 1, a cross-sectional view of a semiconductor device comprising a semiconductor body 100 is schematically illustrated. The semiconductor body 100 may include a conventional semiconductor material such as, for example, silicon (Si), silicon carbide (SW), gallium nitride (GaN), gallium arsenide (GaAs), or the like. A transistor device is formed in the semiconductor body 100, the transistor device being arranged in an active region 220 of the semiconductor body 100. In FIG. 1, only a small section of the transistor device is shown. In its active region 220, the semiconductor body 100 includes at least one working transistor cell 30 with a first gate electrode $33_1$ and a second gate electrode $33_2$ that are each dielectrically insulated from a body region 32 by a gate dielectric 34. The body region 32 is a doped semiconductor region in the active region 220 of the semiconductor body 100. In the example illustrated in FIG. 1, the body region 32 extends from a first surface 101 into the semiconductor body 100, and the gate electrodes $33_1$, $33_2$ are arranged above the first surface 101 of the semiconductor body 100. Each of the transistor cells 30 further includes two source regions $31_1$, $31_2$ extending from the first surface 101 into the body region 32.

The transistor device illustrated in FIG. 1 further includes a drift region 35 formed in the semiconductor body 100. The drift region 35 adjoins the body region 32 of the at least one transistor cell 30 and forms a pn-junction with the body region 32. The drift region 35 is arranged between the body region 32 of the at least one transistor cell 30 and a drain region 36. The drain region 36 may adjoin the drift region 35 (as illustrated). The drain region 36 may form a semiconductor layer 110 that is arranged between a second surface 102 of the semiconductor body 100 and the drift region 35. The second surface 102 is arranged opposite to the first surface 101 in a vertical direction y of the semiconductor body 100. The drain region 36 usually is a continuous region that is common for all of the plurality of transistors cells 30.

Figure 2:
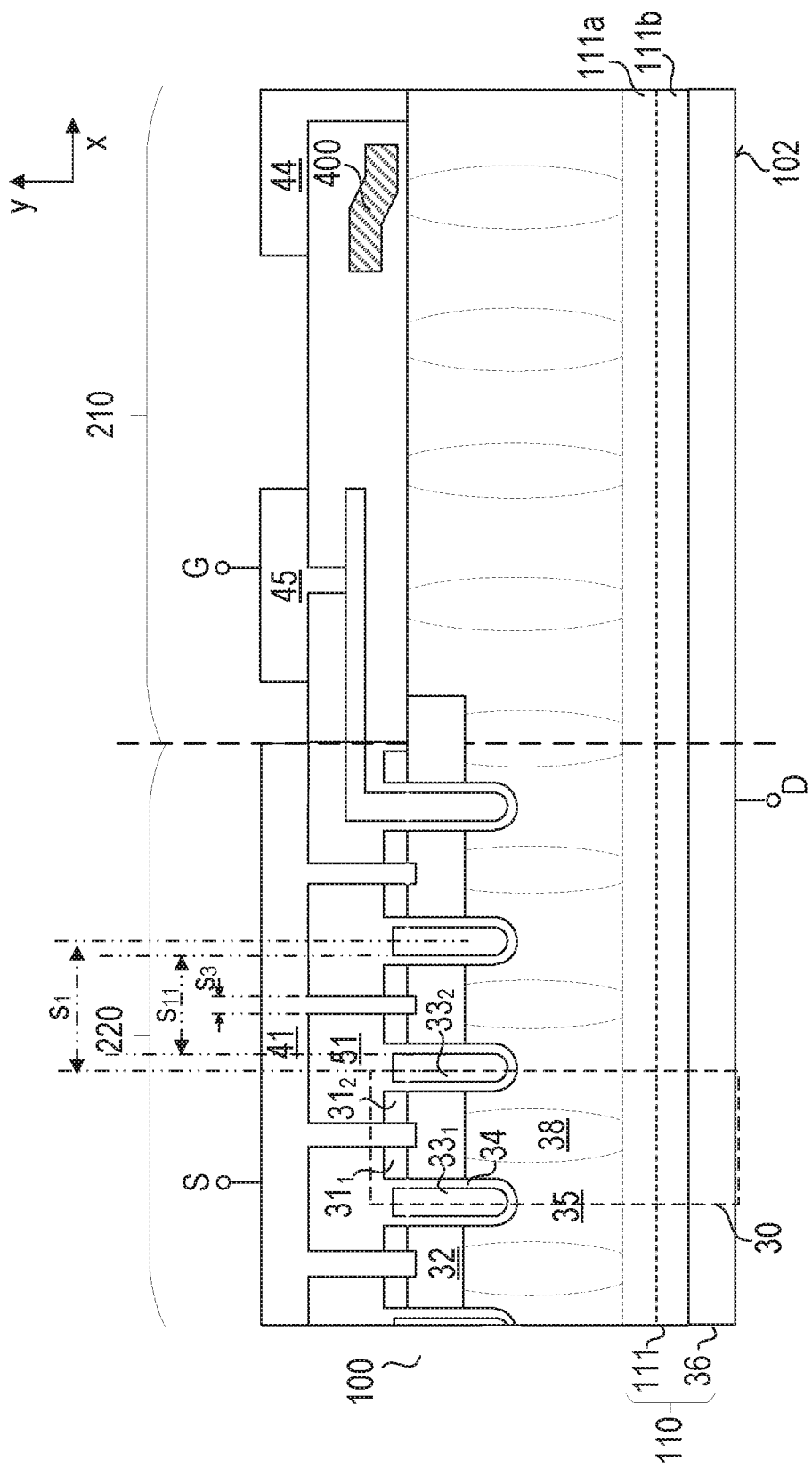
FIG. 2 schematically illustrates a cross sectional view of another semiconductor body.

According to another example, as is illustrated in FIG. 2, a vertical field-stop-region or buffer region 111 of the same doping type as the drift region 35, but less highly doped than the drift region 35, is arranged between the drift region 35 and the drain region 36. According to another example, such a buffer region 111, however, could also be more highly doped than the drift region 35. In a semiconductor body 100 comprising such a field-stop-region 111, the semiconductor layer 110 between the second surface 102 and the drift region 35 may be formed by the drain region 36 and the adjoining field-stop-region 111, as is exemplarily illustrated in FIG. 2. The vertical field-stop-region 111 may be formed by a single layer or by a plurality of separate sub-layers, e.g., at least two sub-layers 111a, 111b. Sub-layers 111n that are arranged closer to the drift region 35 may be less highly doped than sub-layers 111n that are arranged further away from the drift region 35. For example, a doping concentration of a sub-layer 111a that is arranged adjacent to the drift region 35 may be selected from a range of between 1E15 and 1E16 cm$^{-3}$ or lower. A doping concentration of a sub-layer Mb that is arranged adjacent to the drain region 36 may be higher than a doping concentration of a sub-layer 111a that is arranged horizontally above the drain region 36. The doping concentration of the sub-layer 111b that is arranged adjacent to the drain region 36, however, may be lower than a doping concentration of the drain region 36. Generally speaking, a doping concentration of the different sub-layers 111n may increase from the drift region 35 towards the drain region 36.

The transistor device illustrated in FIG. 2 comprises a plurality of trenches extending into the semiconductor body 100, wherein each of the plurality of gate electrodes $33_1$, $33_2$ is arranged in one of the trenches. That is, the transistor cells 30 of the transistor device illustrated in FIG. 2 are trench transistor cells, in contrast to the transistor cells 30 of the transistor device of FIG. 1 which are planar transistor cells. The general structure of the trench transistor cells 30 of FIG. 2, however, is similar to the structure of the planar transistor cells 30 that have been described with respect to FIG. 1 above.

The vertical field-stop-region 111 has been described with regard to a transistor device comprising trench transistor cells 30. This, however, is only an example. In the exemplary transistor device of FIG. 2, the vertical field-stop-region 111 could also be omitted. On the other hand, it would also be possible to arrange a vertical field-stop-region 111 as has been described with respect to FIG. 2 between the drain region 36 and the drift region 35 of the planar transistor device of FIG. 1.

Referring to both FIGS. 1 and 2, the transistor device includes at least one compensation region 38 of a doping type complementary to the doping type of the drift region 35. According to one example, the transistor device includes a plurality of transistor cells 30 and each transistor cell 30 includes a compensation region 38 adjoining the body region 32 of the respective transistor cell 30. In a vertical direction y of the semiconductor body 100, which is a direction perpendicular to the first surface 101, the at least one compensation region 38 extends from the body region 32 into the semiconductor body 100 towards the semiconductor layer 110.

Still referring to FIGS. 1 and 2, the transistor device further includes a source electrode 41. The source electrode 41 is electrically connected to the source regions $31_1$, $31_2$ and the body region 32 of the at least one transistor cell 30 by means of contact plugs 42. The contact plugs 42 may comprise at least one of tungsten, aluminum, copper, highly doped polysilicon, and a Ti/TiN barrier liner, for example. This source electrode 41 forms a source node S or is electrically connected to a source node S of the transistor device. The contact plugs 42 that are arranged below the source electrode 41 extend from the source and body regions 31, 32 through an insulation layer 51 that is formed on the top surface 101 of the semiconductor body 100 to the source electrode 41. The transistor device further includes a drain node 11) electrically connected to the drain region 36. A drain electrode electrically connected to the drain region 36 may form the drain node D. However, such drain electrode is not explicitly illustrated in FIGS. 1 and 2.

The transistor device can be an n-type transistor device or a p-type transistor device. The device type is defined by the doping type of the source region 31. In an n-type transistor device, the source region 31 is an n-type region, the body region 32 is a p-type region, the drift region 35, which has a doping type complementary to the doping type of the body region 32, is an n-type region, and the at least one compensation region 38 is a p-type region. In a p-type transistor device, the source region 31 is a p-type region, the body region 32 is an n-type region, the drift region 35 is a p-type region, and the at least one compensation region 38 is an n-type region. The transistor device can be implemented as a MOSFET or as an IGBT, for example. In a MOSFET, the drain region 36 has the same doping type as the drift region 35, and in an IGBT the drain region 36 (which may also be referred to as collector region) has a doping type complementary to the doping type of the drift region 35. For example, a doping concentration of the drain region 36 is selected from a range of between 1E18 and 1E19 cm$^{-3}$, 1E18 and 1E20 cm$^{-3}$, or 1E18 and 1E21 cm$^{-3}$, doping concentrations of the drift region 35 and the compensation region 38 are selected from a range of between 1E15 and 5E16 cm$^{-3}$, and a doping concentration of the body region 32 is selected from between 5E16 cm$^{-3}$ and 5E17 cm$^{-3}$.

In the transistor device explained above, a plurality of transistor cells 30 is connected in parallel. That is, the source regions $31_1$, $31_2$ of these transistor cells 30 are connected to the source node S, the common drain region 36 is connected to the drain node D, and the at least one gate electrode $33_1$, $33_2$ is connected to a gate node (not illustrated in FIGS. 1 and 2).

The source electrode 41 in the example of FIGS. 1 and 2 is not a continuous layer completely covering the semiconductor body 100. As is illustrated in FIG. 1, for example, a gate runner 43 may be arranged adjacent to the source electrode 41 in a first horizontal direction x of the semiconductor body 100. The source electrode 41 and the gate runner 43 are spaced apart from each other with a gap formed between the source electrode 41 and the gate runner 43. The gate runner 43 may be electrically connected to the gate electrodes $33_1$, $33_2$ of the transistor device, for example (electrical connection between gate runner 43 and gate electrodes $33_1$, $33_2$ not specifically illustrated in FIG. 1). A gate runner 43 generally couples the gate electrodes $33_1$, $33_2$ of the plurality of transistor cells 30 to a gate pad (gate pad not illustrated in FIG. 1). The gate runner 43 may be arranged in the edge termination region 210, for example.

In the examples illustrated in FIGS. 1 and 2, a termination field plate electrode 44 is arranged adjacent to the outer edge of an edge termination region 210. The edge termination region 210 will be described in further detail below. The termination field plate electrode 44 may be electrically connected to the furthest edge of the drift region 35, for example. The example that is schematically illustrated in FIG. 2 further comprises a floating field plate electrode 400. Such a floating field plate electrode 400 may be formed from polycrystalline semiconductor material and may be electrically connected to the termination field plate electrode 44, for example. In the example illustrated in FIG. 2, contact plugs 42, therefore, are used to connect the source electrode 41 to the body regions 32, and further contact plugs (not specifically illustrated in FIG. 2) may be used to connect the field plate electrode 400 to the termination field plate electrode 44. The termination field plate electrode 44 may further be electrically connected to the semiconductor body 100. Field plate arrangements as have been described with respect to FIGS. 1 and 2 as well as many different alternative implementations of field plates are generally known and will not be described in further detail herein.

FIG. 2 further illustrates a gate runner 45. The gate runner 45 may be electrically connected to the gate electrodes $33_1$, $33_2$ of the transistor device, for example. A gate runner 45 generally couples the gate electrodes $33_1$, $33_2$ of the plurality of transistor cells 30 to a gate pad. The gate runner 45 may be arranged in the edge termination region 210.

A semiconductor body 100 usually comprises not only an active region 220, but also a passive region, also referred to as edge termination region 210. The semiconductor arrangement, that is, the plurality of transistor cells 30, may be implemented within the active region 220 of the semiconductor body 100. An edge termination region 210, e.g., may be a region adjacent to the horizontal edges of the semiconductor body 100 (edge region). According to one example, the active region 220 is horizontally surrounded by the edge termination region 210. The edge termination region 210 generally does not comprise any working transistor cells 30. In particular, an edge termination region 210 may be a region that does not include all active components that are necessary to form a functioning (working) transistor cell 30. Active components are, e.g., gate oxide, source regions $31_1$, $31_2$, body regions 32, gate electrodes $33_1$, $33_2$, or drain regions 36. According to another example, edge termination regions 210 may further be formed between two sections of active region 220, e.g., in order to provide so-called gate-fingers.

The source electrode 41 may be arranged on the active region 220 of the semiconductor body 100. The (optional) field plate electrodes 43, 44, 400, for example, may be arranged on the edge termination region 210 of the semiconductor body 100. Generally speaking, conductive field plates may be used in the edge termination region 210 of the semiconductor body 100 in order to spread the electric field more uniformly in the edge termination region 210.

In some semiconductor devices, a width $s_1$ of a single transistor cell 30 in the first horizontal direction x may be large as compared to the width $s_3$ of a contact plug 42 in the same direction x. This results in a distance $s_{11}$ between two neighboring gate electrodes $33_1$, $33_2$ in the first horizontal direction x that is also large as compared to the width $s_2$ of a contact plug 42 in the same direction x. According to one example, the width $s_1$ of a single transistor cell 30 may be 7 µm or less, and the distance $s_{11}$ between two neighboring gate electrodes $33_1$, $33_2$ may be 6.5 µm or less. The width $s_3$ of a contact plug 42, however, may only be 500 nm or less, or even only 300 nm or less which is significantly smaller than the distance $s_{11}$ between two neighboring gate electrodes $33_1$, $33_2$. This is because contact plugs 42 often comprise tungsten or polysilicon. When using tungsten or polysilicon for a contact plug 42, its width $s_3$ is usually limited to a maximum width $s_2$ of several 100 nm (e.g., 500 nm or less, or 300 nm or less). However, when the distance $s_{11}$ between two neighboring gate electrodes $33_1$, $33_2$ is large as compared to the width $s_3$ of a contact plug 42, this may lead to an activation of unwanted parasitic bipolar transistors, which, as a consequence, leads to a decrease of the breakdown voltage or ruggedness (robustness) of the semiconductor device.

Figure 3:
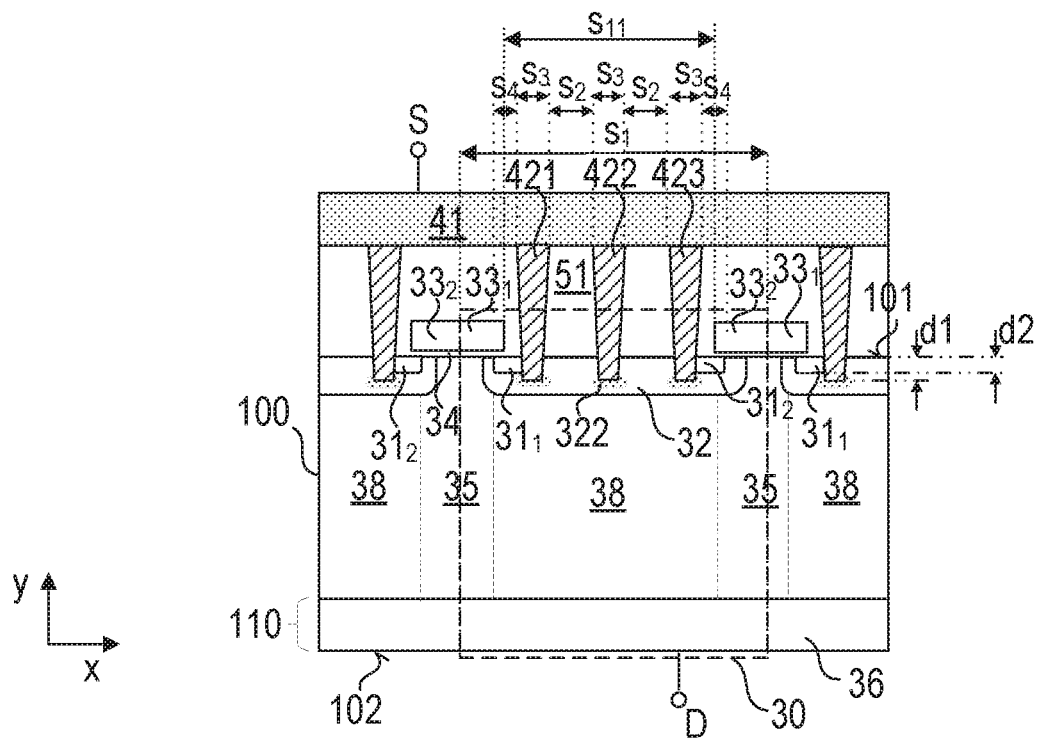
FIG. 3 schematically illustrates a cross sectional view of a semiconductor device according to one example.

Now referring to FIG. 3, in order to avoid the unwanted activation of parasitic bipolar transistors, one transistor cell 30 may comprise at least three contact plugs 421, 422, 423, instead of the single contact plug 42 that has been described with respect to FIGS. 1 and 2 above. According to one example, a semiconductor device comprises a semiconductor body 100 having a first surface 101 and a second surface 102 opposite to the first surface 101 in the vertical direction y. The semiconductor device further comprises a plurality of transistor cells 30 that are at least partly integrated in the semiconductor body 100. In the cross-sectional view of FIG. 3, only one of the plurality of transistor cells 30 is schematically illustrated. Each transistor cell 30 comprises at least two source regions $31_1$, $31_2$, and a first gate electrode $33_1$, and a second gate electrode $33_2$ spaced apart from each other in a first horizontal direction x. Each of the first gate electrode $33_1$ and the second gate electrode $33_2$ is arranged adjacent to and dielectrically insulated from a continuous body region 32. That is, the body region 32 extends continuously from the first gate electrode $33_1$ to the second gate electrode $33_2$. The semiconductor device further comprises a drift region 35 separated from the at least two source regions $31_1$, $31_2$ by the body region 32. At least three contact plugs 421, 422, 423 are arranged between the first gate electrode $33_1$ and the second gate electrode $33_2$ and extend from the body region 32 towards a source electrode 41 in the vertical direction y. The at least three contact plugs 421, 422, 423 are arranged successively between the first gate electrode $33_1$ and the second gate electrode $33_2$. However, as is illustrated in FIG. 3, only the two outermost contact plugs 421, 423 that are arranged closest to the first gate electrode $33_1$ and the second gate electrode $33_2$, respectively, directly adjoin the source regions $31_1$, $31_2$.

In the examples illustrated in FIGS. 1 and 2, the contact plugs 42 have been illustrated as extending into the semiconductor body 100 (into the body regions 32) to a certain degree. This, however, is only an example. As is exemplarily illustrated in FIG. 3, it is also possible that the contact plugs 421, 422, 423 are so-called flat contact plugs that do not extend into the semiconductor body 100. In this case, a lower end of the contact plugs 421, 422, 423 may be arranged adjacent to the first surface 101 of the semiconductor body 100. In this way, the contact plugs 421, 422, 423 may still contact the body regions 32, however without actually extending into the body region 32 in the vertical direction y. The at least three contact plugs 421, 422, 423 in the example of FIG. 3, however, alternatively may also extend into the semiconductor body 100, similar to the contact plugs of FIGS. 1 and 2.

In FIG. 3, two source regions $31_1$, $31_2$ are schematically illustrated. Each of the two source regions $31_1$, $31_2$ is arranged between one of the two outermost contact plugs 421, 423 and the closest gate electrode $33_1$, $33_2$. There are no source regions 31 between an outermost contact plug 421, 423 and the at least one middle contact plug 422. The two source regions $31_1$, $31_2$ are not directly coupled to each other. The source regions $31_1$, $31_2$ are electrically coupled to each other via the two outermost contact plugs 421, 423 and the source electrode 41. The at least one middle contact plug 422 that is arranged between the two outermost contact plugs 421, 423 does not directly adjoin any source region $31_1$, $31_2$. The at least one middle contact plug 422 only adjoins the body region 32. The source regions $31_1$, $31_2$ may extend partly or completely below the respective outermost contact plugs 421, 423 if the contact plugs are implemented as flat contact plugs, for example. In the example illustrated in FIG. 3, the source regions $31_1$, $31_2$ extend partly below the respective outermost contact plugs 421, 423. That is, each of the outermost contact plugs 421, 423 is in direct contact with one of the source regions $31_1$, $31_2$ as well as with the body region 32. If the source regions $31_1$, $31_2$ extend completely below the outermost contact plugs 421, 423 (not specifically illustrated), the outermost contact plugs 421, 423 may not be in direct contact with the body region 32 but only with the respective source region $31_1$, $31_2$. In such a case, the middle contact plugs 422 that are in direct contact with the body region 32 but not with the source regions $31_1$, $31_2$ are used to electrically couple the source electrode to the body region 32.

Optionally, the transistor cell 30 may further comprise at least one or more body contact regions 322 of the same doping type as but more highly doped than the body region 32. A body contact region 322 is arranged between a contact plug 421, 422, 423 and the body region 32 if the respective contact plug 421, 422, 423 at least partly contacts the body region 32. A contact plug that does not directly contact the body region 32 (source region extends completely below the contact plug) may not comprise a body contact region 322. In the example of FIG. 3, such body contact regions 322 are illustrated in dotted lines. Each of the body contact regions 322 is arranged between one of the contact plugs 421, 422.423 and the body region 32.

By providing at least three contact plugs 421, 422, 423 for each transistor cell 30, an avalanche current that may occur during operation of the semiconductor device is conducted away through the at least one middle contact plug 422. That is, a current flows in a central part of the transistor cell towards the at least one middle contact plug 422. In this way, a hole current along the body region 32 directly adjacent to the source region 31 may be reduced drastically. Thereby, the base voltage of a parasitic npn-transistor remains closer to the corresponding emitter voltage, avoiding an unwanted parasitic turn on of the semiconductor device.

Figure 4:
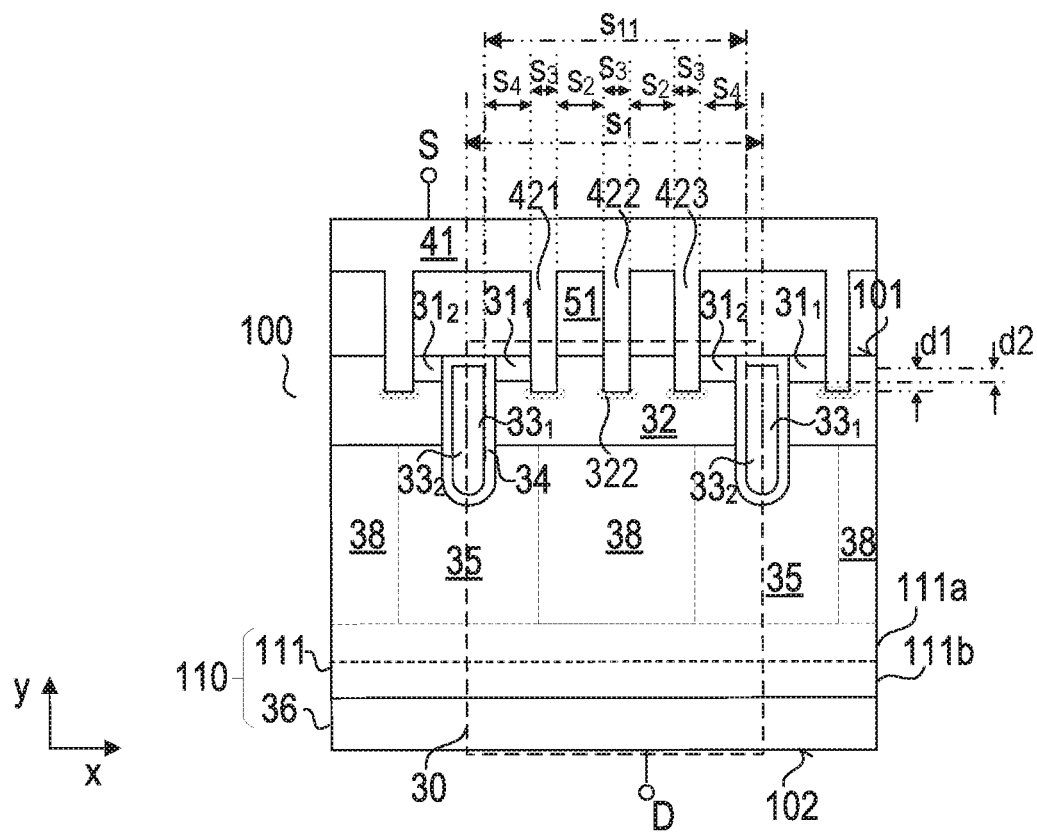
FIG. 4 schematically illustrates a cross sectional view of a semiconductor device according to another example.

FIG. 3 schematically illustrates a planar transistor cell, wherein FIG. 4 schematically illustrates a trench transistor cell. The general principles that have been described with respect to FIG. 3 above apply, mutatis mutandis, to the trench transistor cell of FIG. 4. In contrast to FIG. 3, FIG. 4 illustrates contact plugs 421, 422, 423 that extend into the semiconductor body 100. However, such contact plugs 421, 422, 423 may also be implemented as flat contact plugs, as has been described with respect to FIG. 3 above. On the other hand, it is also possible to implement contact plugs 421, 422, 423 that extend into the semiconductor body 100 (see FIG. 4) in the arrangement of FIG. 3.

Still referring to FIGS. 3 and 4, similar to what has been described with respect to FIGS. 1 and 2 above, each transistor cell 30 of the plurality of transistor cells 30 may further comprise a compensation region 38 of a doping type complementary to the doping type of the drift region 35. The compensation region 38 extends from the body region 32 into the drift region 35 in the vertical direction y.

In the first horizontal direction x, a distance $s_2$ between two neighboring contact plugs 421, 422, 423 may be greater than a distance $s_4$ between each of the outermost contact plugs 421, 423 and the closest gate electrode $33_1$, $33_2$, respectively. According to one example, the distance $s_2$ between two neighboring contact plugs 421, 422, 423 may be between 100 nm and 500 nm. The distance $s_4$ between each of the outermost contact plugs 421, 423 and the closest gate electrode $33_1$, $33_2$ may be between 100 nm and 400 nm, for example.

In FIGS. 3 and 4, only one transistor cell 30 is illustrated in its entirety. Two neighboring transistor cells 30 are only partly illustrated. However, as can be seen in FIGS. 3 and 4, two directly successive transistor cells 30 may share a common gate electrode $33_1$, $33_2$. That is, one half of a gate electrode $33_1$ may be part of one of the transistor cells 30, and another half of the same gate electrode $33_2$ may be part of the next directly successive transistor cell 30. This applies for planar gate electrodes (FIG. 3), as well as for trench gate electrodes 33 (FIG. 4).

Figure 5:
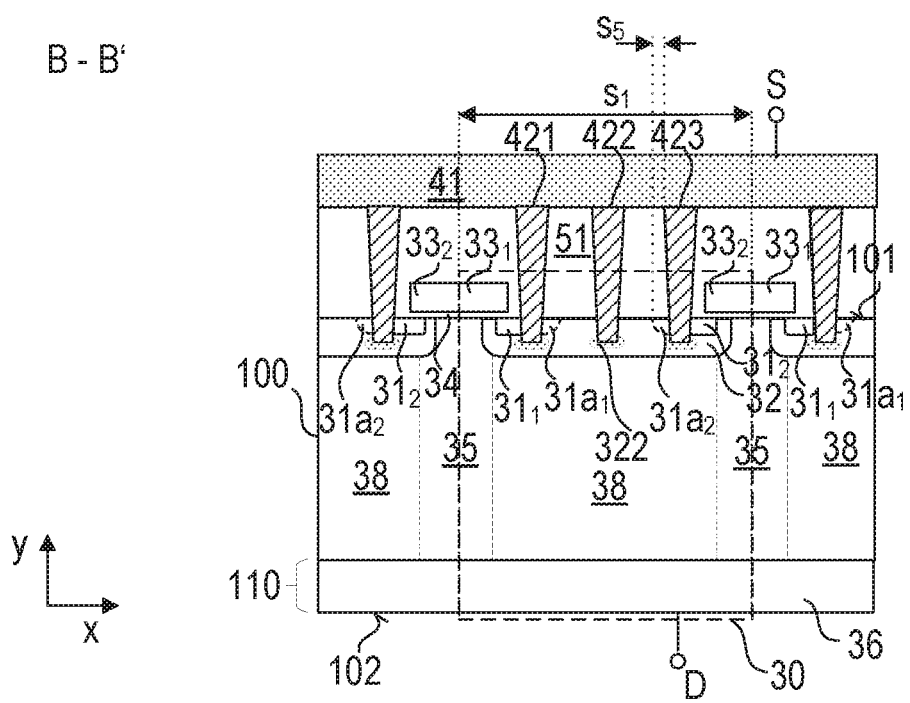
FIG. 5 schematically illustrates a cross sectional view of a semiconductor device according to another example.
Figure 6:
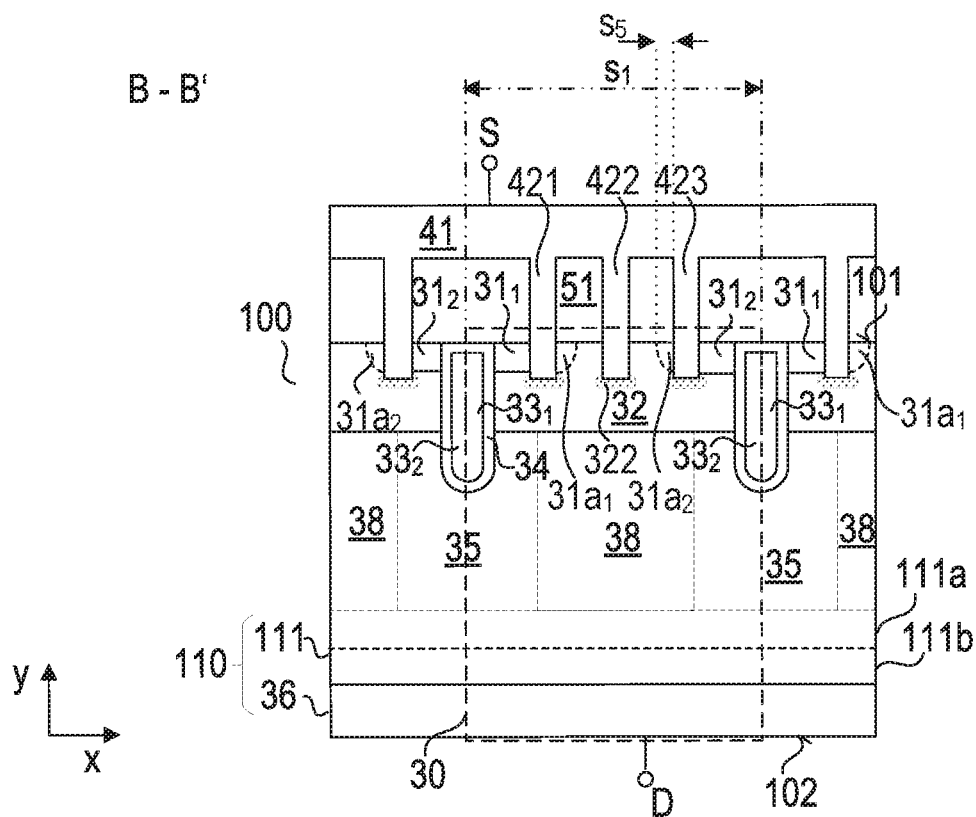
FIG. 6 schematically illustrates a cross sectional view of a semiconductor device according to another example.

Now referring to FIG. 5 (planar transistor cell) and FIG. 6 (trench transistor cell), each transistor cell 30 may further comprise at least two source extension regions $31a_1$, $31a_2$. The source extension regions $31a_1$, $31a_2$ may be formed unintentionally for process-related reasons, for example. The source regions $31_1$, $31_2$ are generally formed by implanting and subsequently diffusing ions of either the first type or the second type. During the diffusion process, ions may unintentionally diffuse in the first horizontal direction x. That is, a width of the source regions $31_1$, $31_2$ in the first horizontal direction x may be larger than desired. When forming contact plugs 421, 422, 423 that extend into the semiconductor body 100, the source extension regions $31a_1$, $31a_2$ may be separated from the source regions $31_1$, $31_1$. No source extension regions $31a_1$, $31a_2$ may be formed in arrangements comprising flat contact plugs 421, 422, 423 (see, e.g., FIG. 3). An unintentional diffusion of ions in the first horizontal direction x, however, is only one possible reason for the process-related formation of source extension regions $31a_1$, $31a_2$. Other reasons may be inaccuracies, misalignments, or deviations of the size of the openings of a mask that is used during the step of implanting the ions in the semiconductor body 100. The embodiments that are exemplarily illustrated in FIGS. 5 and 6 generally correspond to the embodiments of FIGS. 3 and 4, respectively, with additional source extension regions $31a_1$, $31a_2$ formed adjacent to the outermost contact plugs 421, 423. Such source extension regions may introduce further parasitic npn-transistors, which may reduce the avalanche ruggedness (robustness) of the semiconductor device.

A first source extension region $31a_1$ is arranged adjacent to a first outermost contact plug 421 that is arranged closest to the first gate electrode $33_1$. The first source extension region $31a_1$ extends from the first outermost contact plug 421 in the first horizontal direction x away from the first gate electrode $33_1$. The second source extension region $31a_2$ extends from the second outermost contact plug 423 in the first horizontal direction x away from the second gate electrode $33_2$. A width $s_5$ of each of the at least two source extension regions $31a_1$, $31a_2$ in the first horizontal direction x may be smaller than twice the distance $s_4$ between the outermost contact plugs 421, 423 and the respective gate electrode $33_1$, $33_2$ ($s_5<2*s_4$). According to another example, the width $s_5$ of each of the at least two source extension regions $31a_1$, $31a_2$ in the first horizontal direction x may be smaller than the distance $s_4$ between the outermost contact plugs 421, 423 and the respective gate electrode $33_1$, $33_2$ ($s_5<s_4$ or even $s_5<0.5*s_4$).

The semiconductor device may comprise a plurality (at least two) of transistor cells 30, as has been described above. The plurality of transistor cells 30 may be arranged in an active region 220 of the semiconductor body 100. As has been described above, in its active region 220, the semiconductor body 100 includes at least one working transistor cell 30 with a first and a second gate electrode $33_1$, $33_2$ that is dielectrically insulated from a body region 32 by a gate dielectric 34.

Figure 7:
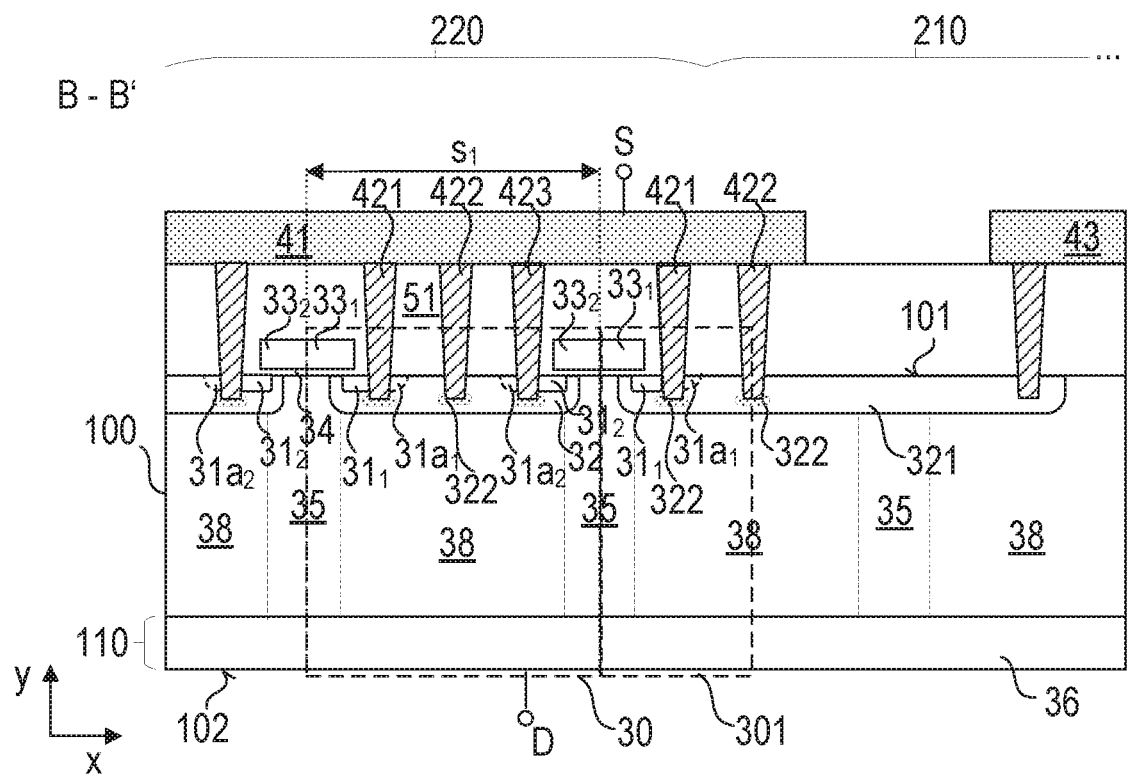
FIG. 7 schematically illustrates a cross sectional view of a semiconductor device according to another example.
Figure 8:
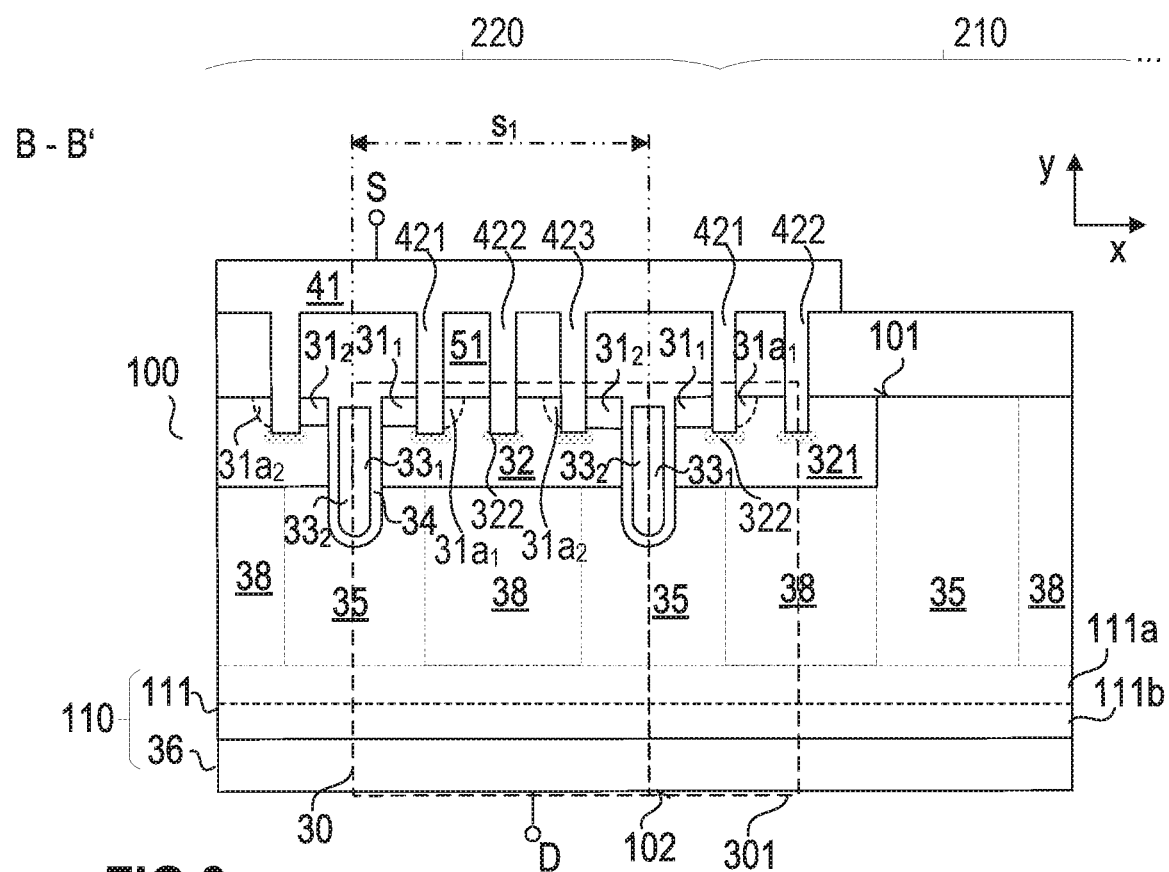
FIG. 8 schematically illustrates a cross sectional view of a semiconductor device according to another example.

Now referring to FIGS. 7 and 8, the semiconductor device may further comprise at least one bordering transistor cell 301 which forms a transition between the active region 220 and the edge region 210. For example, a semiconductor device may comprise two bordering transistor cells 301, each of the bordering transistor cells 301 bordering the active region 220 on each side towards the edge region 210 in the first horizontal direction x. The structure of the bordering transistor cells 301 may differ from the structure of the transistor cells 30 in the active region 200 of the semiconductor body 100.

According to one example, as illustrated in FIGS. 7 and 8, a bordering transistor cell 301 may only comprise one gate electrode $33_1$ and one source region $31_1$. The source region $31_1$ of a bordering transistor cell 301 may extend from the first surface 101 into a base region 321 formed in the semiconductor body 100. The base region 321 may be of the same doping type as the body regions 32 of the transistor cells 30 in the active region 220. The base region 321 may extend from the first surface 101 into the semiconductor body 100 and may have a larger width in the horizontal direction x as compared to the body regions 32 of the transistor cells 30 in the active region 220. The base region 321 is dielectrically insulated from the gate electrode $33_1$ by a gate dielectric 34.

The gate electrode $33_1$ of a bordering transistor cell 301 may be arranged adjacent to the second gate electrode $33_2$ of a neighboring transistor cell 30 in the active region 220. In other words, the outermost transistor cell 30 of the active region 220 may share a gate electrode $33_1$, $33_2$ with a bordering transistor cell 301. The bordering transistor cell 301 does not comprise a second gate electrode $33_2$ in the transition zone towards the edge region 210. The bordering transistor cell 301 may further not comprise a second source region $31_2$ in the transition zone towards the edge region 210. As is further illustrated in dashed lines in FIGS. 7 and 8, a bordering transistor cell 301 may further comprise a single optional source extension region $31a_1$. The bordering transistor cell 301 may not comprise a second source extension region $31a_2$ in the transition zone towards the edge region 210. In other embodiments, the bordering transistor cell 301 may not comprise any source region 31 at all.

In the examples illustrated in FIGS. 7 and 8, the bordering transistor cell 301 comprises a first contact plug 421 and a second contact plug 422. In other words, the bordering transistor cell 301 may essentially correspond to one half of a transistor cell 30 in the active region 220. The second contact plug 422 of the bordering transistor cell 301 may have the same function as the second contact plug 422 (and any optional additional middle contact plugs), as has been described with respect to FIGS. 3 to 6 above. That is, the risk of an unwanted activation of parasitic bipolar transistors may also be reduced in each of the at least one bordering transistor cell 301.

A bordering transistor cell 301 comprising two contact plugs 421, 422, however, is only an example. Generally, it is also possible that a bordering transistor cell 301 only comprises a first contact plug 421 that adjoins the first source region $31_1$, the body region 321, and the optional source extension region $31a_1$. That is, a second or any further contact plugs may be omitted in a bordering transistor cell 301. According to another example, however, a bordering transistor cell 301 may also comprise more than two contact plugs. For example, the number of contact plugs in a bordering transistor cell 301 may equal the number of contact plugs in a transistor cell 30 in the active region 220. This may provide advantages during production of the semiconductor device, as a more uniform layout may be used for the transistor cells 30 in the active region 220 and the bordering transistor cells 301.

Irrespective of whether the at least one bordering transistor cell 301 comprises only one or more than one contact plug, only one contact plug 421 may adjoin the single source region $31_1$ and the optional single source extension region $31a_1$. That is, only the first contact plug 421 that is arranged closest to the single gate electrode $33_1$ may adjoin the single source region $31_1$ and the single optional source extension region $31a_1$. A contact plug of a bordering transistor cell 301 that is not arranged closest to the first gate electrode $33_1$ only adjoins the base region 321.

As is further illustrated in FIGS. 7 and 8, a bordering transistor cell 301 may further comprise at least one body contact region 322 of the same doping type as but more highly doped than the base region 321. In the examples of FIGS. 7 and 8, such body contact regions 322 are illustrated in dotted lines. The number of body contact regions 322 may equal the number of contact plugs of the bordering transistor cell 301. Each of the body contact regions 322 is arranged between one of the contact plugs 421, 422 and the base region 321.

In the examples described by means of FIGS. 3 to 8 above, each transistor cell 30 comprises two source region $31_1$, $31_2$ and at least three contact plugs 421, 422, 423. This, however, is only an example. According to another example, it is also possible that a transistor cell 30 only comprises one source region $31_1$ and one optional source extension region $31a_1$. In FIGS. 7 and 8 this is indicated by illustrating the second source region $31_2$ (and second optional source extension region $31a_2$) with a dotted line. In such a case, it may also be sufficient to provide only two contact plugs 421, 422, wherein one of the two outermost contact plugs 421 directly adjoins the single source region $31_1$ and the single optional source extension region $31a_1$. If a transistor cell 30 with a single source region $31_1$ (single in this context has the meaning of one, but not more than one, source region $31_1$) comprises two or more than two contact plugs, there may be at least one contact plug, which does not directly adjoin the source region $31_1$. In the examples of FIGS. 7 and 8, if the second source region $31_2$ is omitted, only the first contact plug 421 directly adjoins the single source region $31_1$, while the other contact plug 422 (and optionally any further contact plugs 423) do not directly adjoin the single source region $31_1$. That is, according to one example, only a first contact plug 421 that is arranged closest to one of the gate electrodes $33_1$ directly adjoins the single source region $31_1$.

Providing only one source region $31_1$ for each transistor cell 30 may further increase the short-circuit resistance of the device.

Figures 9A, 9B:
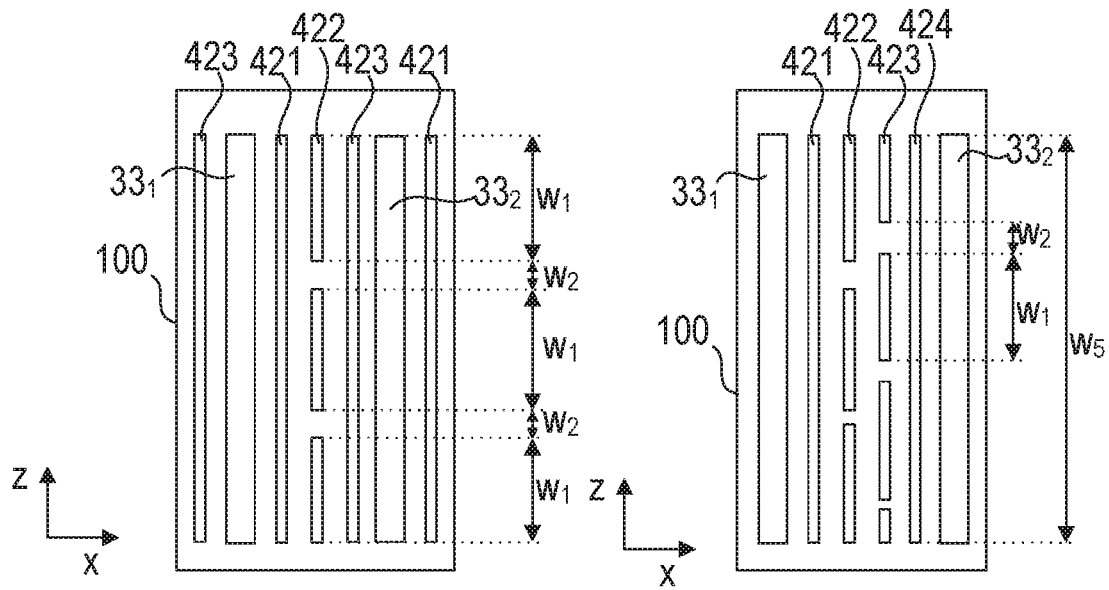
FIGS. 9A and 9B schematically illustrate respective top views of semiconductor devices according to different examples.

Now referring to FIGS. 9A-9B, which illustrate respective top views of a semiconductor device according to several examples, the contact plugs 421, 422, 423 may be elongated contact plugs having a length $w_5$ in a second horizontal direction z that is significantly larger than its maximum width $s_3$ in the first horizontal direction x. According to one example, the length $w_5$ of the contact plugs 421, 422, 423 in the second horizontal direction z may be several 100 µm or even up to several millimeters. This may cause problems during the step of forming the contact plugs 421, 422, 423, in particular when a resist mask is formed on the semiconductor body 100 while etching trenches for the contact plugs 421, 422, 423.

Therefore, according to one example, at least one of the contact plugs (e.g., contact plug 422 in FIG. 9A) may be divided into at least two separate sections. Each of the separate sections may have a maximum length $w_1$ in the second horizontal direction z that is, e.g., 200 µm or less. In the examples of FIG. 9A (three contact plugs 421, 422, 423) and FIG. 9B (four contact plugs 421, 422, 423, 424), only the middle contact plugs (422 in FIG. 9A, and 422, 423 in FIG. 9B) are each divided into a plurality of different sections. The two outermost contact plugs (421, 423 in FIG. 9A, and 421, 424 in FIG. 9B) in the illustrated examples are continuous contact plugs. This, however, is only an example. It is also possible to divide one or both of the outermost contact plugs into several separate sections. A distance $w_2$ between two neighboring sections of the same contact plugs 421, 422, 423, 424 in the second horizontal direction z may be several µm, for example.

In the example of FIG. 9A, a first gate electrode $33_1$ and a second gate electrode $33_2$ with three contact plugs 421, 422, 423 arranged in between the first and the second gate electrodes $33_1$, $33_2$ are schematically illustrated. Further, the outermost contact plugs 421, 423 of the respective neighboring transistor cells (only partly illustrated in the Figures) are also schematically illustrated in FIG. 9A. FIG. 9B schematically illustrates a first gate electrode $33_1$ and a second gate electrode $33_2$ with four contact plugs 421, 422, 423, 424 arranged between the first gate electrode $33_1$ and the second gate electrode $33_2$. The source regions $31_1$, $31_2$ and source extension regions $31a_1$, $31a_2$ are not specifically illustrated in FIGS. 9A and 9B.

Figure 10:
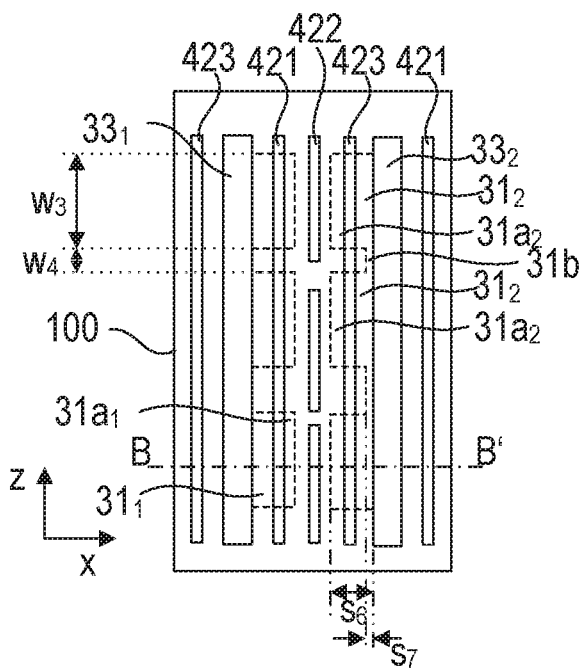
FIG. 10 schematically illustrates a top view of a semiconductor device according to another example.

Now referring to FIG. 10, the exemplary semiconductor device of FIG. 9A is illustrated with the source regions $31_1$, $31_2$ and source extension regions $31a_1$, $31a_2$ schematically indicated in dashed lines. In the second horizontal direction z, each source region $31_1$, $31_2$ may be divided in two or more separate sections. The different sections of the source regions $31_1$, $31_2$ may not have a direct connection to each other and may only be connected to each other via the corresponding contact plug (e.g., first source region $31_1$ and first contact plug 421 in FIG. 10). It is, however, also possible that the different sections of the source regions $31i$, $31_2$ may have a direct connection to each other. This is exemplarily illustrated in FIG. 10 by means of the second source region $31_2$ that is arranged adjacent to the third contact plug 423. In this example, the different sections of this second source region $31_2$ are connected to each other by means of narrow bridging sections $31b$. A width $s_7$ of the bridging sections $31b$ in the first horizontal direction x may be less than a width $s_6$ of the separate sections of the corresponding source region $31_2$ in the first horizontal direction x, e.g., the width $s_7$ of the bridging sections $31b$ in the first horizontal direction x may be less than 50% or less than 25% of the width $s_6$ of the corresponding source region $31_2$ in the first horizontal direction x.

Each of the separate sections of the source regions $31_1$, $31_2$ may have a maximum length $w_3$ in the second horizontal direction z that is, e.g., 200 µm or less. A distance $w_4$ between two neighboring sections of the same source region $31_1$, $31_2$ in the second horizontal direction z may be several µm, for example.

FIGS. 5 and 6 that have been described above schematically illustrate cross-sectional views of the semiconductor device of FIG. 10 in a section plane B-B'.

What has been described with respect to FIGS. 94-9B and 10 above also applies mutatis mutandis to semiconductor devices wherein each transistor cell 30 only comprises a single source region $31_1$ and at least two contact plugs 421, 422.

Figure 11:
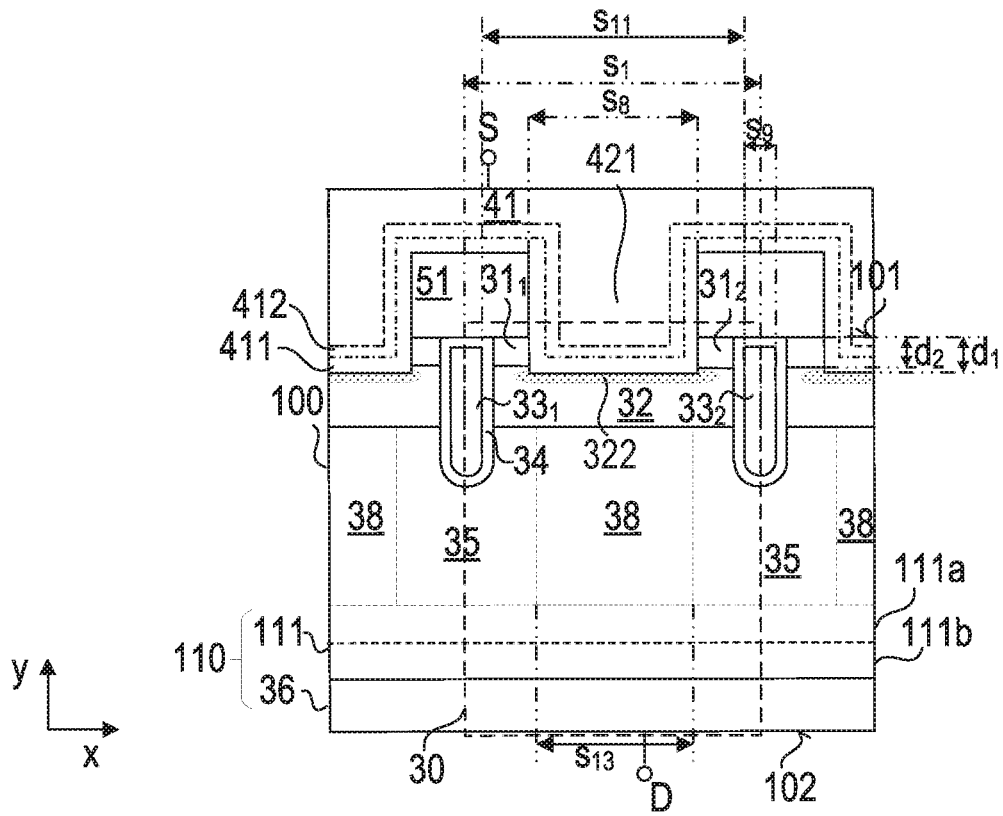
FIG. 11 schematically illustrates a cross sectional view of a semiconductor device according to another example.

Now referring to FIG. 11, instead of at least three (or at least two if a transistor cell comprises only one source region 310 subsequent narrow contact plugs 421, 422, 423, it is also possible to arrange a single extended contact plug 421 between two neighboring gate electrodes $33_1$, $33_2$. The width $s_1$ of a single transistor cell 30 in the first horizontal direction x may be 7 µm or less, and the distance $s_{11}$ between two neighboring gate electrodes $33_1$, $33_2$ in the first horizontal direction x may be 6.5 µm or less, as has been described with respect to FIGS. 3 and 4 above. The width $s_8$ of a single extended contact plug 421 in the first horizontal direction x may be, e.g., at least 5 µm or at least 6 µm, depending on the distance $s_{11}$ between two neighboring gate electrodes $33_1$, $33_2$. That is, the width $s_8$ of a single extended contact plug 421 may only be slightly smaller than the distance $s_{11}$ between two neighboring gate electrodes $33_1$, $33_2$. In this way, the single extended contact plug 421 basically extends along almost the complete distance $s_{11}$ between two neighboring gate electrodes $33_1$, $33_2$. The width $s_8$ of a single extended contact plug 421 may equal the width $s_{13}$ of a compensation region 38, for example, or may even be greater than the width $s_{13}$ of a compensation region 38.

The single extended contact plug 421 may comprise different layers, for example. As is schematically illustrated in FIG. 11, the single extended contact plug 421 may comprise three layers, namely a first layer 411, a second layer 412 and a metal layer 41. The metal layer 41 may form or may be connected to a source electrode. The metal layer 41 may be the topmost layer. The first layer 411 may be a lowermost layer. That is, the first layer 411 may be in direct contact with the source regions $31_1$, $31_2$ and the body region 32. The second layer 412 may be arranged between the first layer 411 and the metal layer 41. The first layer 411 may be a barrier layer that comprises titanium nitride (TiN), for example. The second layer 412 may comprise tungsten (W), for example. The metal layer 41 may comprise aluminum (Al), for example. These, however, are merely examples. Any other suitable materials may be used to form the first layer 411, the second layer 412, and the metal layer 41. The remaining structure of the transistor cell 30 illustrated in FIG. 11 is similar to the structure that has been described with respect to FIGS. 1 and 2 above. Optionally, the transistor cell 30 may further comprise a body contact region 322 of the same doping type as but more highly doped than the body region 32. In the example of FIG. 11, such a body contact region 322 is illustrated in a dotted line. The (optional) body contact region 322 is arranged between the single extended contact plug 421 and the body region 32.

As is schematically illustrated in FIG. 11, the metal layer 41 extends in the vertical direction y towards the body region 32. The metal layer 41 may partly extend into the semiconductor body 100 in the vertical direction y. That is, a lowest end of the metal layer 41 may extend into the semiconductor body 100 to below the first surface 101. This, however, is only an example. It is also possible that a lowest end of the metal layer 41 ends well above the first surface 101 in the vertical direction y (not illustrated).

The gate electrodes $33_1$, $33_2$ may be narrow as compared to the single extended contact plug 421. That is, a width $s_9$ of a gate electrode $33_1$, $33_2$ in the first horizontal direction x may be significantly smaller than the width $s_8$ of the single extended contact plug 421. According to one example, the width $s_9$ of a gate electrode 33 in the first horizontal direction x may be 2 μm or less. In the example of FIG. 11, the width $s_9$ of a gate electrode refers to a width of a shared gate electrode $33_1$, $33_2$. That is, a first gate electrode $33_1$ of one transistor cell 30 and an adjoining second gate electrode $33_2$ of a directly successive transistor cell 30.

In the vertical direction y, the single extended contact plug 421 may extend into the semiconductor body 100 into a depth $d_1$ that is deeper than the depth $d_2$ of the source regions $31_1$, $31_2$ in the vertical direction y. That is, the depth $d_1$ of a lowest end of the first layer 411 may be deeper than the depth $d_2$ of a lowest end of the source regions $31_1$, $31_2$.

Figure 12:
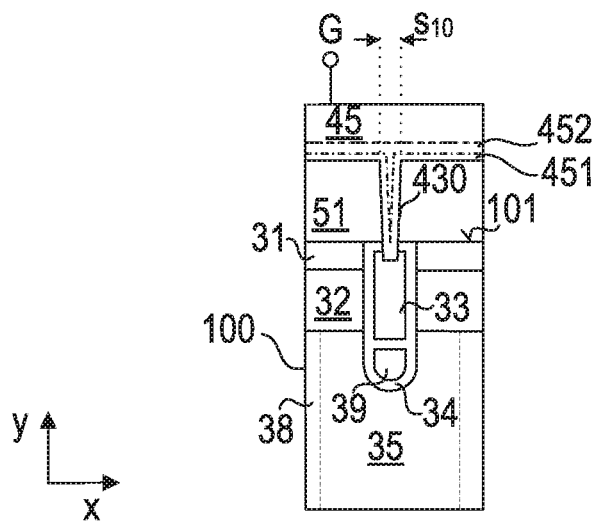
FIG. 12 schematically illustrates a cross sectional view of a semiconductor device according to another example.

Now referring to FIG. 12, a gate contact plug 430 is schematically illustrated which electrically couples a gate electrode 33 to a gate runner 45. A semiconductor device usually comprises a gate pad (not illustrated) which forms or which may be coupled to a gate node G. A gate runner 45 usually connects the plurality of gate electrodes 33 to the gate pad. The gate runner 45 may comprise a metal layer that is arranged above the first surface 101. The gate runner 45 may be a circumferential layer which extends along the outer edges of the semiconductor body 100, for example. Each of the gate electrodes 33 is usually coupled to the gate runner 45 by means of a gate contact plug 430. The gate contact plugs 430, of which one is exemplarily illustrated in FIG. 12, may be narrow as compared to the single extended contact plugs 421 of the transistor cells 30. That is, a width $s_{10}$ of a gate contact plug 430 in the first horizontal direction x may be small as compared to the width $s_8$ of a single extended contact plug 421 in the first horizontal direction x. According to one example, the width $s_{10}$ of a gate contact plug 430 in the first horizontal direction x may be smaller than the width $s_9$ of a shared gate electrode 33 in the first horizontal direction x. That is, the width $s_{10}$ of a gate contact plug 430 in the first horizontal direction x may be less than 1 μm or even less than 0.5 μm.

The gate contact plug 430 may comprise two or more layers. For example, the gate contact plug 430 may comprise a barrier layer 451 and an intermediate layer 452. The barrier layer 451 may be a lowermost layer. That is, the barrier layer 451 may directly adjoin the shared gate electrode 33 and the insulation layer 51 that is formed on the top surface 101 of the semiconductor body 100. The barrier layer 451 may comprise titanium nitride (TiN), for example. The intermediate layer 452 may be arranged on the barrier layer 451. That is, the barrier layer 451 may be arranged between the intermediate layer 452 and the gate electrode 33, and between the intermediate layer 452 and the insulation layer 51, respectively. The gate runner 45 may be arranged on top of the intermediate layer 452. That is, the intermediate layer 452 may be arranged between the gate runner 45 and the barrier layer 451.

As the width $s_{10}$ of a gate contact plug 430 in the first horizontal direction x is comparably small, the intermediate layer 452 may only partly extend into a trench that extends through the insulation layer 51 towards the gate electrode 33. Such trenches, due to process related reasons, usually taper towards the gate electrode 33 to a certain degree. Therefore, when forming the barrier layer 451 within the trench, a bottom of the trench will be completely filled with the material of the barrier layer 451, leaving only a comparably small remaining trench to be filled with the material of the intermediate layer 452.

The narrow gate contact plugs 430 that have been described with respect to FIG. 12 may be combined with the single extended contact plug 421 of FIG. 11, for example.

Narrow contact plugs, as have been described with respect to FIG. 12 above, may additionally or alternatively be used to contact other elements of the semiconductor device. As is exemplarily illustrated in FIG. 12, an additional field plate electrode 39 may be arranged below the gate electrode 33. "Below" in this context means that the gate electrode 33 is arranged between the additional field plate electrode 39 and the first surface 101 of the semiconductor body 100 in the vertical direction y. The (optional) field plate electrode 39 may comprise a layer of electrically conducting material. According to one example, an (optional) additional field plate electrode 39 may be formed by a layer of polysilicon. The additional field plate electrode 39 may be electrically connected to the source node S of the semiconductor device or to the gate node G, for example. A narrow contact plug, as has been described with respect to the gate contact plug 430 above, may also be used to electrically contact the additional field plate electrode 39. Such a narrow contact plug for electrically contacting an additional field plate electrode 39 is not specifically illustrated in FIG. 12 but essentially corresponds to the gate contact plug 430 that has been described above. That is, a width of a contact plug for contacting an additional field plate electrode 39 may be small as compared to the width $s_8$ of a single extended contact plug 421 (see FIG. 11). According to one example, the width of a contact plug for contacting the additional field plate electrode 39 in the first horizontal direction x may be smaller than the width $s_9$ of a shared gate electrode 33 in the first horizontal direction x (see FIG. 11). That is, the width of a contact plug for contacting the additional field plate electrode 39 in the first horizontal direction x may be less than 2 μm or even less than 1 μm.

Figure 13:
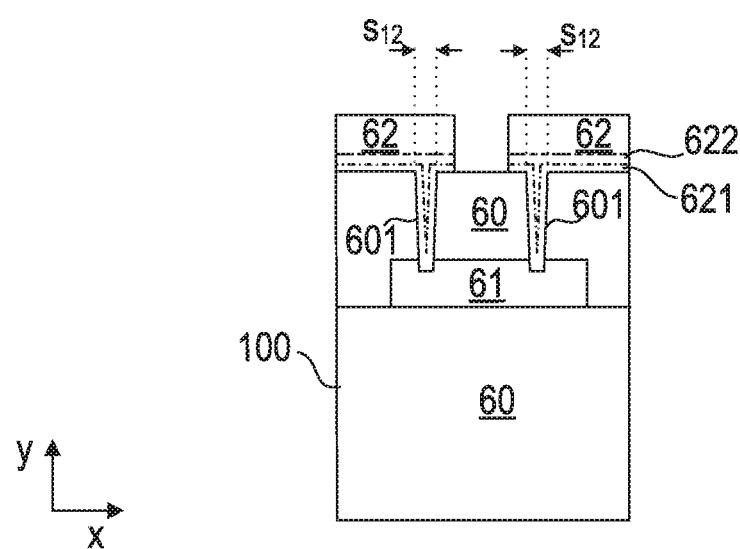
FIG. 13 schematically illustrates a cross sectional view of a semiconductor device according to another example.

Now referring to FIG. 13, one or more narrow contact plugs 601 may be used to electrically contact a conducting layer 61 that is arranged in or on the semiconductor body 100. The conducting layer 61 may be a layer of polysilicon, for example. According to one example, a semiconductor device may further comprise at least one diode integrated in the conducting layer 61. The at least one diode may be an ESD protective diode, for example. In FIG. 13, a single continuous conducting layer 61 is schematically illustrated. However, at least one pn-junction may be formed within this conducting layer 61, for example, to form the at least one diode. According to one example, two or more diodes may be formed in the conducting layer 61 such that they are electrically coupled in series between two contact plugs 601. Each of the contact plugs 601 electrically couples the conducting layer 61 to a respective metal layer 62 formed on the semiconductor body 100. According to one example, the conducting layer 61 may be electrically insulated from other components of the semiconductor device by at least one oxide layer 60.

The additional contact plugs 601, two of which are exemplarily illustrated in FIG. 13, may be narrow as compared to the single extended contact plugs 421 of the transistor cells 30 (see FIG. 11). That is, a width 512 of an additional contact plug 601 in the first horizontal direction x may be small as compared to the width $s_8$ of a single extended contact plug 421 in the first horizontal direction x. According to one example, the width 512 of an additional contact plug 601 in the first horizontal direction x may be smaller than the width $s_9$ of a shared gate electrode 33 in the first horizontal direction x. That is, the width $s_{12}$ of an additional contact plug 601 in the first horizontal direction x may be less than 2 µm or even less than 1 µm, for example.

Each of the additional contact plugs 601 may comprise two or more layers. For example, an additional contact plug 601 may comprise a barrier layer 621 and an intermediate layer 622. The barrier layer 621 may be a lowermost layer. That is, the barrier layer 621 may directly adjoin the conducting layer 61. The barrier layer 621 may comprise titanium nitride (TiN), for example. The intermediate layer 622 may be arranged on the barrier layer 621. That is, the barrier layer 621 may be arranged between the intermediate layer 622 and the conducting layer 61. The metal layer 62 may be arranged on top of the corresponding intermediate layer 622. That is, the intermediate layer 622 may be arranged between the metal layer 62 and the barrier layer 621.

As the width $s_{12}$ of an additional contact plug 601 in the first horizontal direction x is comparably small, the intermediate layer 622 may only partly extend into a trench that extends from the metal layer 62 towards the conducting layer 61. Such trenches, due to process related reasons, usually taper towards the conducting layer 61 to a certain degree. Therefore, when forming the barrier layer 621 within the trench, a bottom of the trench will be completely filled with the material of the barrier layer 621, leaving only a comparably small remaining trench to be filled with the material of the intermediate layer 622.

The narrow additional contact plugs 601 that have been described with respect to FIG. 13 may be combined with the single extended contact plug 421 of FIG. 11, and with the narrow gate contact plug 430 of FIG. 12, for example. The plugs that have been described with respect to FIGS. 12 and 13 may further be combined with the arrangements as have been described with respect to FIGS. 3-8 above.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor body comprising a first surface and a second surface opposite to the first surface in a vertical direction;
a plurality of transistor cells at least partly integrated in the semiconductor body, each of the plurality of transistor cells comprising:
at least two source regions;
a first gate electrode and a second gate electrode spaced apart from each other in a first horizontal direction, each of the first gate electrode and the second gate electrode being arranged adjacent to and dielectrically insulated from a continuous body region;
a drift region separated from the at least two source regions by the continuous body region; and
at least three contact plugs extending from the continuous body region towards a source electrode in the vertical direction,
wherein the at least three contact plugs are arranged successively between the first gate electrode and the second gate electrode,
wherein only two outermost ones of the contact plugs that are arranged closest to the first gate electrode and the second gate electrode, respectively, directly adjoin at least one of the source regions,
wherein each of the plurality of transistor cells further includes a first source extension region arranged adjacent to a first outermost one of the contact plugs that is arranged closest to the first gate electrode, and extending from the first outermost contact plug in the first horizontal direction away from the first gate electrode.

2. The semiconductor device of claim 1, wherein each of the plurality of transistor cells further comprises a compensation region of a doping type complementary to the doping type of the drift region and extending from a respective body region into the drift region in the vertical direction.

3. The semiconductor device of claim 1, wherein each of the plurality of transistor cells has a first width in the first horizontal direction, and wherein the first width is 7 µm or less.

4. The semiconductor device of claim 1, wherein each of the at least three contact plugs has a maximum width in the first horizontal direction of 500 nm or less.

5. The semiconductor device of claim 1, wherein a distance between two directly successive ones of the contact plugs is greater than a distance between the outermost contact plugs and the respective gate electrode.

6. The semiconductor device of claim 5, wherein the distance between the outermost contact plugs and the respective gate electrode is between 100 nm and 400 nm.

7. The semiconductor device of claim 1, wherein each of the plurality of transistor cells further comprises at least three body contact regions of the same doping type as, but more highly doped than, the continuous body region, and wherein each of the body contact regions is arranged between one of the contact plugs and the continuous body region.

8. The semiconductor device of claim 1, wherein each of the at least three contact plugs is an elongated contact plug having a length in a second horizontal direction that is larger than a maximum width of the elongated contact plug in the first horizontal direction.

9. The semiconductor device of claim 8, wherein at least one of the three contact plugs in the second horizontal direction is divided into at least two separate sections, and wherein each of the at least two separate sections has a maximum length in the second horizontal direction that is 200 µm or less.

10. The semiconductor device of claim 1, wherein two directly successive transistor cells have a common gate electrode.

11. The semiconductor device of claim 1, wherein each of the plurality of transistor cells further comprises:
a second source extension region arranged adjacent to a second outermost one of the contact plugs that is arranged closest to the second gate electrode, and extending from the second outermost contact plug in the first horizontal direction away from the second gate electrode.

12. The semiconductor device of claim 11, wherein a width of each of the first and second source extension regions in the first horizontal direction is smaller than twice the distance between the first and second outermost contact plugs and the respective gate electrode.

13. The semiconductor device of claim 12, wherein the width of each of the first and second source extension regions in the first horizontal direction is smaller than the distance between the first and second outermost contact plugs and the respective gate electrode.

14. The semiconductor device of claim 1, further comprising at least one bordering transistor cell forming a transition between an active region and an edge region of the semiconductor body and at least partly integrated in the semiconductor body, each of the at least one bordering transistor cell comprising:
 a single source region;
 a single first gate electrode arranged adjacent to and dielectrically insulated from a continuous base region;
 a drift region separated from the single source region by the continuous base region; and
 at least one contact plug extending from the base region towards the source electrode in the vertical direction,
 wherein only a first contact plug that is arranged closest to the first gate electrode directly adjoins the single source region.

15. A semiconductor device, comprising:
 a semiconductor body comprising a first surface and a second surface opposite to the first surface in a vertical direction;
 a plurality of transistor cells at least partly integrated in the semiconductor body, each of the plurality of transistor cells comprising:
  a single source region;
  a first gate electrode and a second gate electrode spaced apart from each other in a first horizontal direction, each of the first gate electrode and the second gate electrode being arranged adjacent to and dielectrically insulated from a continuous body region;
  a drift region separated from the source region by the continuous body region; and
  at least two contact plugs extending from the continuous body region towards a source electrode in the vertical direction,
 wherein the at least two contact plugs are arranged successively between the first gate electrode and the second gate electrode,
 wherein at least one of the at least two contact plugs does not directly adjoin the source region.

16. The semiconductor device of claim 15, wherein each of the plurality of transistor cells further comprises a compensation region of a doping type complementary to the doping type of the drift region and extending from a respective body region into the drift region in the vertical direction.

17. The semiconductor device of claim 15, wherein each of the plurality of transistor cells further comprises at least three body contact regions of the same doping type as, but more highly doped than, the continuous body region, and wherein each of the body contact regions is arranged between one of the contact plugs and the continuous body region.

18. The semiconductor device of claim 15, wherein each of the plurality of transistor cells further comprises:
 a first source extension region arranged adjacent to a first outermost one of the contact plugs that is arranged closest to the first gate electrode, and extending from the first outermost contact plug in the first horizontal direction away from the first gate electrode; and
 a second source extension region arranged adjacent to a second outermost one of the contact plugs that is arranged closest to the second gate electrode, and extending from the second outermost contact plug in the first horizontal direction away from the second gate electrode.

19. The semiconductor device of claim 15, further comprising at least one bordering transistor cell forming a transition between an active region and an edge region of the semiconductor body and at least partly integrated in the semiconductor body, each of the at least one bordering transistor cell comprising:
 a single source region;
 a single first gate electrode arranged adjacent to and dielectrically insulated from a continuous base region;
 a drift region separated from the single source region by the continuous base region; and
 at least one contact plug extending from the base region towards the source electrode in the vertical direction,
 wherein only a first contact plug that is arranged closest to the first gate electrode directly adjoins the single source region.

20. The semiconductor device of claim 15, wherein each of the at least two contact plugs is an elongated contact plug having a length in a second horizontal direction that is larger than a maximum width of the elongated contact plug in the first horizontal direction.

21. A semiconductor device, comprising:
 a semiconductor body comprising a first surface and a second surface opposite to the first surface in a vertical direction;
 a plurality of transistor cells at least partly integrated in the semiconductor body,
 each of the plurality of transistor cells comprising:
  at least two source regions;
  a first gate electrode and a second gate electrode spaced apart from each other in a first horizontal direction, each of the first gate electrode and the second gate electrode being arranged adjacent to and dielectrically insulated from a continuous body region;
  a drift region separated from the at least two source regions by the continuous body region; and
  at least three contact plugs extending from the continuous body region towards a source electrode in the vertical direction,
 wherein the at least three contact plugs are arranged successively between the first gate electrode and the second gate electrode,
 wherein only two outermost ones of the contact plugs that are arranged closest to the first gate electrode and the second gate electrode, respectively, directly adjoin at least one of the source regions,
 wherein each of the at least three contact plugs is an elongated contact plug having a length in a second horizontal direction that is larger than a maximum width of the elongated contact plug in the first horizontal direction,
 wherein at least one of the three contact plugs in the second horizontal direction is divided into at least two separate sections, and wherein each of the at least two separate sections has a maximum length in the second horizontal direction that is 200 um or less.

\* \* \* \* \*